(12) United States Patent
Shaw et al.

(10) Patent No.: US 12,294,384 B2
(45) Date of Patent: May 6, 2025

(54) VOLTAGE IDENTIFICATION SIGNAL DECODER WITH PRECHARGING

(71) Applicant: TEXAS INSTRUMENTS INCORPORATED, Dallas, TX (US)

(72) Inventors: Vishal Shaw, Howrah (IN); Preetam Charan Anand Tadeparthy, Bangalore (IN); Mayank Jain, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 139 days.

(21) Appl. No.: 18/086,204

(22) Filed: Dec. 21, 2022

(65) Prior Publication Data
US 2024/0214002 A1 Jun. 27, 2024

(51) Int. Cl.
*H03M 1/82* (2006.01)
*G06F 1/26* (2006.01)
*H03K 5/156* (2006.01)
*H03K 7/08* (2006.01)
*H03M 1/06* (2006.01)
*H03M 1/12* (2006.01)

(52) U.S. Cl.
CPC .............. *H03M 1/822* (2013.01); *G06F 1/26* (2013.01); *H03K 5/156* (2013.01); *H03K 7/08* (2013.01); *H03M 1/0626* (2013.01); *H03M 1/1205* (2013.01)

(58) Field of Classification Search
CPC .. H03M 1/822; H03M 1/0626; H03M 1/1205; H03K 7/08; H03K 5/156; G06F 1/26
USPC ........................................................ 341/143
See application file for complete search history.

(56) References Cited

U.S. PATENT DOCUMENTS

| | | | | |
|---|---|---|---|---|
| 5,886,640 A | * | 3/1999 | Wang | G06F 1/30 700/297 |
| 6,944,783 B2 | * | 9/2005 | Yu | G06F 1/26 713/340 |
| 7,366,928 B2 | * | 4/2008 | Park | G06F 1/26 713/300 |
| 8,952,638 B2 | | 2/2015 | Han | |
| 2018/0337589 A1 | | 11/2018 | Xu | |
| 2019/0181848 A1 | | 6/2019 | Kim | |

OTHER PUBLICATIONS

International Search Report and Written Opinion mailed May 8, 2024, PCT Application No. PCT/US2023/084721, 12 pages.

* cited by examiner

*Primary Examiner* — Khai M Nguyen
(74) *Attorney, Agent, or Firm* — Charles F. Koch; Frank D. Cimino

(57) ABSTRACT

In an example, an apparatus includes a first decoder circuit having a first voltage identification (VID) analog input and a first digital output. The apparatus also includes a precharge circuit having a digital input and a first analog output, the digital input coupled to the first digital output. The apparatus also includes a second decoder circuit having a second VID analog input, a precharge analog input and a second digital output, the precharge analog input coupled to the first digital output. The apparatus also includes a multiplexer having a multiplexer output and first and second multiplexer inputs, the first multiplexer input coupled to the first digital output, and the second multiplexer input coupled to the second digital output.

20 Claims, 5 Drawing Sheets

VOLTAGE IDENTIFICATION SIGNAL DECODER WITH PRECHARGING

BACKGROUND

Power supply circuits may be implemented to provide devices, such as computers, with a direct current (DC) voltage. The power supply circuits can be provided in a voltage regulator circuit that provides an output voltage (VOUT) to other components in a computer system, such as a central processing unit (CPU). Some CPUs implement dynamic voltage transitions, such that the CPU can dictate the amount of the output voltage. At higher performances that consume larger computational resources, the CPU can request a higher output voltage. Conversely, at lower performances, and therefore lower computational resources consumed, the CPU may request a smaller output voltage, thereby conserving power. The CPU can communicate such power requests to a power controller associated with the voltage regulator.

SUMMARY

In an example, an apparatus includes a first decoder circuit having a first voltage identification (VID) analog input and a first digital output. The apparatus also includes a precharge circuit having a digital input and a first analog output, the digital input coupled to the first digital output. The apparatus also includes a second decoder circuit having a second VID analog input, a precharge analog input and a second digital output, the precharge analog input coupled to the first digital output. The apparatus also includes a multiplexer having a multiplexer output and first and second multiplexer inputs, the first multiplexer input coupled to the first digital output, and the second multiplexer input coupled to the second digital output.

In an example, an apparatus includes a first decoder circuit, a precharge circuit, a second decoder circuit, and a multiplexer. The first decoder circuit has a first VID analog input and a first digital output, the first decoder circuit configured to provide a first digital code at the first digital output based on a VID signal from the first VID analog input. The precharge circuit has a digital input and a first analog output, the digital input coupled to the first digital output, the precharge circuit configured to receive the first digital code at the digital input and provide a precharge signal at the first analog output based on the first digital code. The second decoder circuit has a second VID analog input, a precharge analog input, and a second digital output, the precharge analog input coupled to the first digital output, the second decoder circuit configured to provide a second digital code at the second digital output based on the precharge signal and the VID signal received via the second VID analog input, wherein a resolution of the first decoder circuit is less than a resolution of the second decoder circuit. The multiplexer has a multiplexer output, first and second multiplexer inputs, and a selection input, the first multiplexer input coupled to the first digital output, and the second multiplexer input coupled to the second digital output, the multiplexer configured to provide the first digital code at the multiplexer output responsive to a first state of a selection signal at the selection input and to provide the second digital code at the multiplexer output responsive to a second state of the selection signal.

In an example, a voltage regulator includes power stages configured to provide respective output voltages and a power controller. The power controller is configured to receive an analog VID signal representing a target voltage, and selectively activate one or more of the power stages to reduce a difference between the target voltage and a sum of the respective output voltages, the power controller comprising a VID signal decoder circuit to decode the VID signal. The VID signal decoder circuit includes a first decoder circuit, a precharge circuit, a second decoder circuit, and a multiplexer. The first decoder circuit has a first VID analog input and a first digital output, the first decoder circuit configured to provide a first digital code at the first digital output based on a VID signal from the first VID analog input. The precharge circuit has a digital input and a first analog output, the digital input coupled to the first digital output, the precharge circuit configured to receive the first digital code at the digital input and provide a precharge signal at the first analog output based on the first digital code. The second decoder circuit has a second VID analog input, a precharge analog input, and a second digital output, the precharge analog input coupled to the first digital output, the second decoder circuit configured to provide a second digital code at the second digital output based on the precharge signal and the VID signal received via the second VID analog input, wherein a resolution of the first decoder circuit is less than a resolution of the second decoder circuit. The multiplexer has a multiplexer output, first and second multiplexer inputs, and a selection input, the first multiplexer input coupled to the first digital output, and the second multiplexer input coupled to the second digital output, the multiplexer configured to provide the first digital code at the multiplexer output responsive to a first state of a selection signal at the selection input and to provide the second digital code at the multiplexer output responsive to a second state of the selection signal.

DETAILED DESCRIPTION

Figure 1:
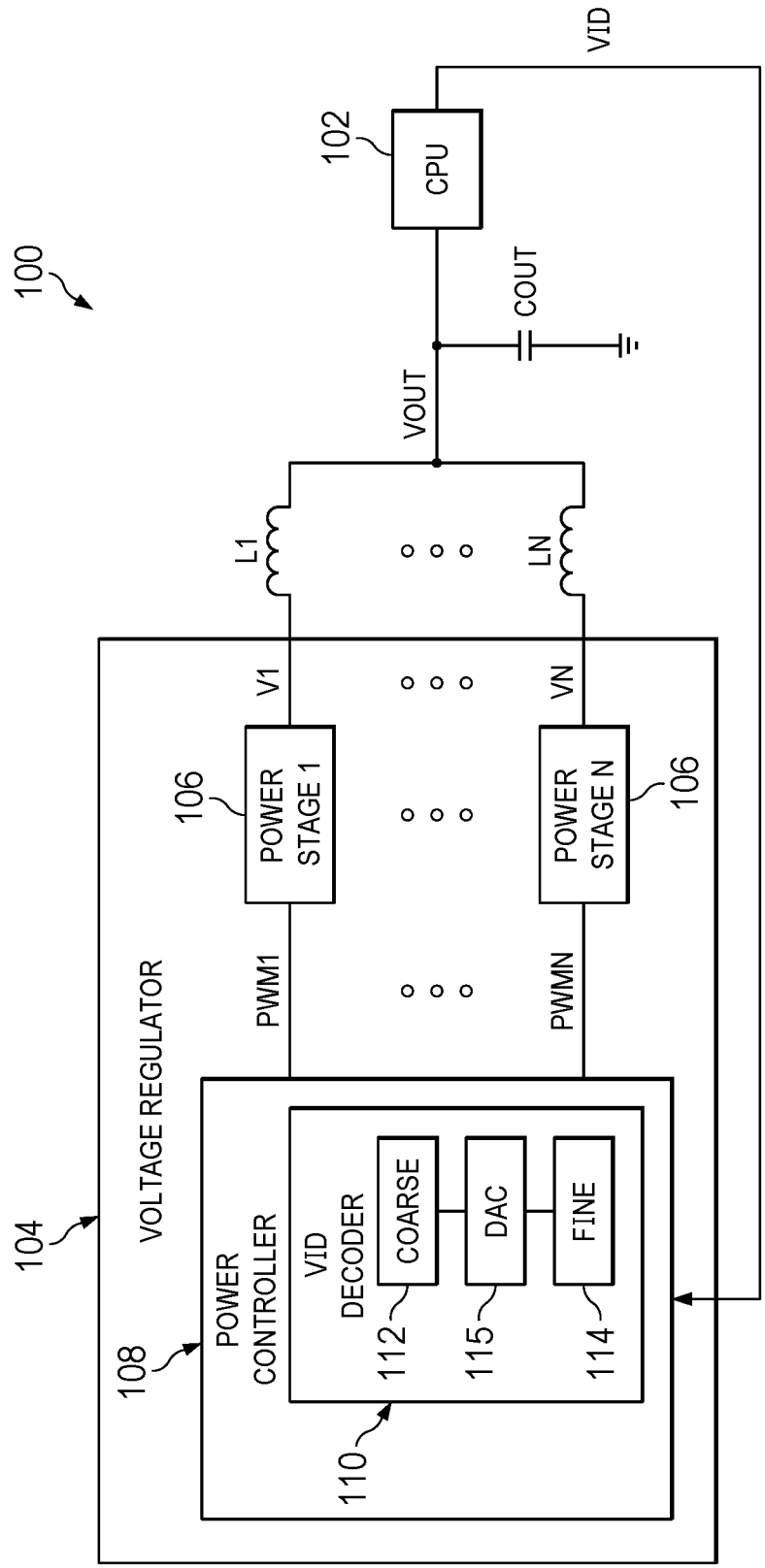
FIG. 1 is a block diagram of a computer system, in accordance with various examples.

As described above, a CPU, or other device, can provide a request for a power supply circuit to supply an output voltage having a particular value or within a particular range of values. The value or range of values may be for any suitable parameter or parameters, such as voltage, current, or the like. A voltage identification (VID) signal decoder may decode a signal (e.g., a VID signal) including the request to determine the particular value or range. The VID signal decoder can be implemented in a power controller of a voltage regulator circuit capable of providing an adaptive, or alterable, output voltage to a system. For example, the system can include a CPU capable of implementing dynamic voltage transitions, as described above, such that the CPU may provide the VID signal to request an amplitude of the output voltage provided from the voltage regulator circuit to the CPU as a supply voltage of the CPU. In an example, the VID signal is provided as a pulse-width modulated (PWM) signal having a duty-cycle that corresponds to an amplitude of the requested supply voltage. In some examples, the amplitude is encoded according to any suitable encoding scheme. For example, the VID signal can have an eight-bit digital code encoded therein to indicate the amplitude of the supply voltage requested by the CPU.

In some examples, the VID signal decoder is configured to receive and decode the VID signal to determine the amplitude of output voltage provided from the voltage regulator circuit to the CPU as the supply voltage. Some implementations of the VID signal decoder include a coarse resolution decoder circuit and a fine resolution decoder circuit. The coarse resolution decoder circuit provides a first digital code that is a coarse duty-cycle code corresponding to the decoded VID signal. The fine resolution decoder circuit provides a second digital code that is a fine duty-cycle code corresponding to the decoded VID signal. In an example, an output voltage provided according to the first digital code has a margin of error with respect to a value of the supply voltage requested by the CPU that is greater than that of an output voltage provided according to the second digital code. However, a greater amount of time may elapse in determining the second digital code than in determining the first digital code, thus increasing a delay in providing the output voltage to the CPU.

For example, the coarse resolution decoder circuit can provide a more rapid decoding of the VID signal to provide the first digital code at lesser accuracy than the fine resolution decoder circuit. Conversely, the fine resolution decoder circuit can provide a slower decoding of the VID signal to provide the second digital code at greater accuracy than the coarse resolution decoder circuit. In an example, the coarse resolution decoder circuit includes a counter configured to determine an on-time and an off-time of each period of the VID signal, and can include a PWM decoder configured to provide the first digital code based on a relative difference between the on-time and the off-time of the VID signal. In an example, the fine resolution decoder circuit can include an analog filter configured to filter the VID signal to provide an analog value associated with the duty-cycle of the VID signal and an analog-to-digital converter (ADC) configured to provide a digital representation of the analog value associated with the duty-cycle of the VID signal as the second digital code.

As described above, a time elapsed for the fine resolution decoder circuit to provide the second digital code may be greater than a time elapsed for the coarse resolution decoder circuit to provide the first digital code. However, the second digital code may result in an output voltage that has a greater degree of accuracy with respect to a value of the supply voltage requested by the CPU. To decrease the elapsed time for the fine resolution decoder circuit to provide the second digital code (e.g., increase a speed of the fine resolution decoder circuit), the fine resolution decoder circuit may be biased according to the first digital code. For example, a capacitor of the analog filter of the fine resolution decoder circuit may be precharged, or biased, based on the first digital code. Because operation of the coarse resolution decoder circuit is faster than operation of the fine resolution decoder circuit, biasing the fine resolution decoder circuit based on the output of the coarse resolution decoder circuit (e.g. the first digital code) increases a speed of the fine resolution decoder circuit in providing the second digital code.

In an example, the VID signal decoder also includes a multiplexer that receives the first and second digital codes provided by the respective coarse and fine resolution decoder circuits. The multiplexer is configured to provide the first or second digital codes as an output based on a selection signal. Therefore, the output signal provided by the multiplexer corresponds to the decoded VID signal provided by the coarse or fine resolution decoder circuits. In an example, the selection signal is provided based on a relative difference in amplitude between the first and second digital codes, such as to within a predetermined number of least significant bits (LSBs) (e.g., two LSBs). For example, the selection signal may initially be provided at a first state, such that multiplexer provides the first digital code as the output to provide a rapid decoding of the VID signal via the coarse resolution decoder circuit. Thus, the output voltage can begin to rapidly converge on the amplitude requested by the VID signal, as provided by the first digital code. Responsive to the second digital code being close in amplitude to the first digital code (e.g., within two LSBs), the selection signal can switch to a second state, such that the multiplexer provides the second digital code as the output to provide a more accurate decoding of the VID signal via the fine resolution decoder circuit. Accordingly, the VID signal decoder can provide both rapid (e.g., approximately 10 microsecond (µs) or less) but less accurate, as well as accurate but slower (e.g., approximately 25-30 µs or less) decoding of the VID signal.

FIG. 1 is block diagram of a computer system 100, in accordance with various examples. The computer system 100 can be implemented as part of any of a variety of computing devices, such as computers, mobile devices, wearable devices, servers, or any other computing device. The computer system 100 includes a CPU 102 that is configured to implement any of a variety of processing functions, such as according to software, firmware, or a combination thereof, programming of the CPU 102. As described herein, the CPU 102 is capable of implementing dynamic voltage transitions, such that the CPU 102 can request a value of a supply voltage it receives from a power supply to perform certain computing functions. For example, at higher performances that consume larger amounts of computational resources, the CPU 102 can request a higher value supply voltage. Conversely, during times in which operation of the CPU 102 does not consume large amounts of computational resources, the CPU 102 may request a small supply voltage, thereby conserving power. To request the value of the supply voltage, the CPU 102 provides a VID signal, shown in the example of FIG. 1 as VID.

In the example of FIG. 1, the computer system 100 includes a voltage regulator 104 configured to provide VOUT, such as to the CPU 102, such that VOUT is the supply voltage of the CPU 102. The voltage regulator 104 includes a number N of power stages 106, where N is a positive integer. The power stages 106 each provide a separate voltage V1 through VN at respective inductors L1 through LN, such that the voltages V1 through VN collectively correspond to (e.g., are summed to form or provide) VOUT based on selective activation of the power stages 106. The voltage regulator 104 includes a power controller 108 that is configured to selectively activate the power stages 106 based on the VID signal, such that the voltages V1 through VN provided via some or all of the power stages 106, respectively, combine to form VOUT at an amplitude that is defined by the VID signal. In the example of FIG. 1, the selective activation is shown as PWM signals PWM1 through PWMN that are provided to the respective power stages 106 to control the providing of and/or the amplitude of the respective voltages V1 through VN.

In the example of FIG. 1, the power controller 108 includes a VID signal decoder 110 that is configured to decode the VID signal to determine the supply voltage amplitude requested by the CPU 102. In an example, the VID signal decoder 110 includes a coarse resolution decoder circuit 112 and a fine resolution decoder circuit 114. For example, the coarse resolution decoder circuit 112 can operate in the digital domain and the fine resolution decoder circuit 114 can operate in the analog domain. The coarse resolution decoder circuit 112 provides a first digital code corresponding to the decoded VID signal, such as based on a more rapid decoding scheme of the VID signal than the fine resolution decoder circuit 114. Conversely, the fine resolution decoder circuit 114 provides a second digital code corresponding to the decoded VID signal, such as based on a more accurate decoding scheme of the VID signal than the coarse resolution decoder circuit 112. In an example, the fine resolution decoder circuit 114 is coupled to the coarse resolution decoder circuit 112 via a digital-to-analog converter (DAC) 115. The DAC 115 may convert the first digital code to an analog representation and provide the analog representation to the fine resolution decoder circuit 114 to bias or precharge the fine resolution decoder circuit 114. Based on the biasing, an amount of time for the fine resolution decoder circuit 114 to determine and provide the second digital code may be reduced. For example, as described above, the VID signal may be encoded with a number of digital bits, such as 8-bits, to represent a value of the requested supply voltage. The coarse resolution decoder circuit 112 may determine a first 6 of the 8 bits encoded in the VID signal and provide those 6 bits as the first digital code. In this way, rather than determining all 8 bits of the VID signal, the fine resolution decoder circuit 114 is biased according to the first 6 bits of the encoded VID signal, leaving the remaining 2 bits to be determined by the fine resolution decoder circuit. In an example, the biasing of the this description reduces a time for the fine resolution decoder circuit 114 to provide the second digital code from about 9*ln(2)*T to about 2*ln(2)*T, where T is a time constant of the fine resolution decoder circuit 114. As described in greater detail below, the VID signal decoder 110 can be configured to decode the VID signal based on a combination of the first and second digital codes, and thus in both a rapid and accurate manner, to provide a rapid and accurate response of providing VOUT to the amplitude requested by the CPU 102 via the VID signal.

Figure 2:
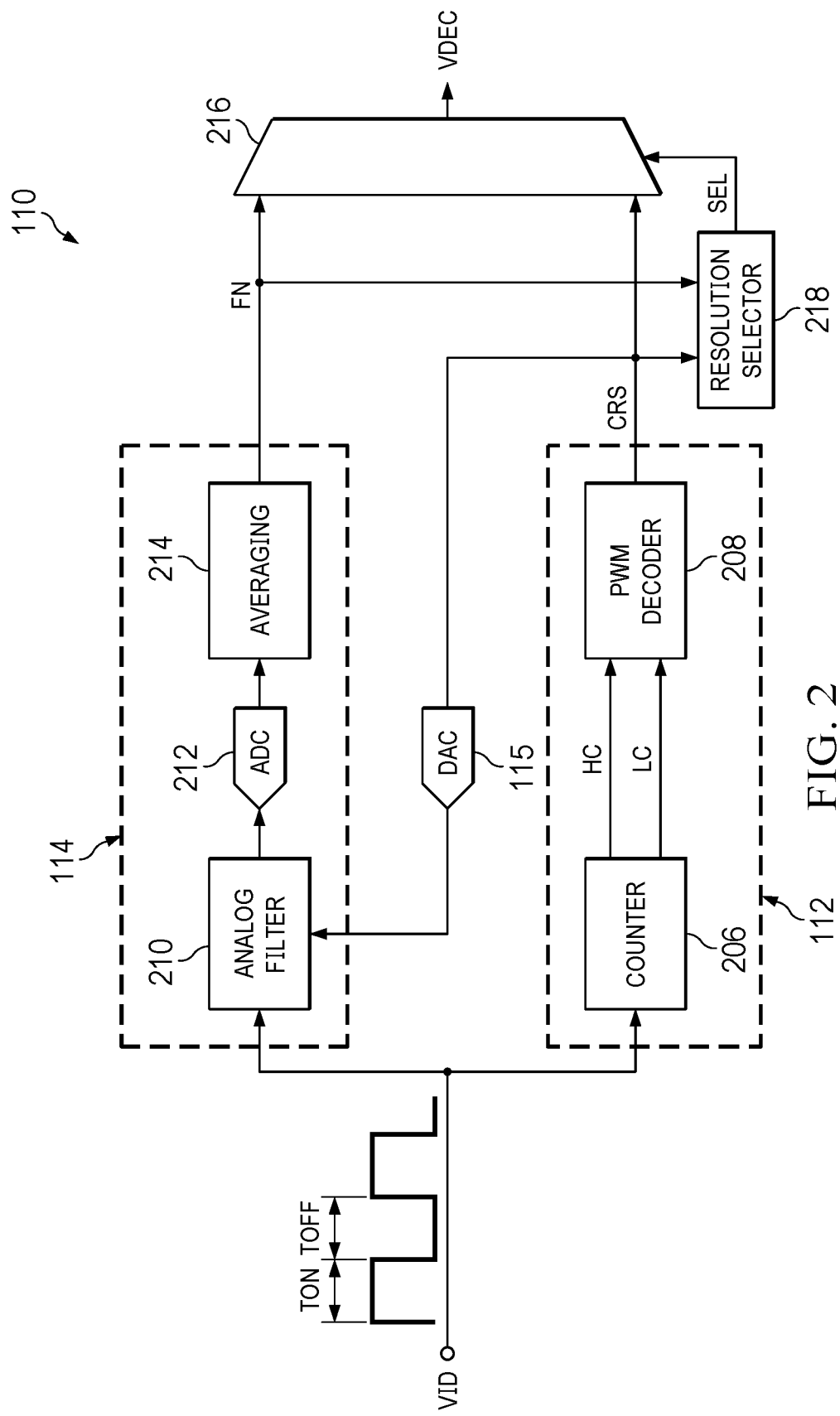
FIG. 2 is a block diagram of a voltage identification signal decoder, in accordance with various examples.

FIG. 2 is a block diagram of the VID signal decoder 110, in accordance with various examples. Therefore, reference is to be made to the example of FIG. 1 in the following description of the example of FIG. 2. In various examples, the VID signal decoder 110 can be implemented as a combination of hardware, firmware, and/or software, such as to decode the VID signal.

The VID signal decoder 110 includes the coarse resolution decoder circuit 112, the fine resolution decoder circuit 114, and the DAC 115. The coarse and fine resolution decoder circuits 112 and 114 are each configured to receive the VID signal and to separately decode the VID signal. In an example, the decoding by the fine resolution decoder circuit 114 is biased based on an output (e.g., the first digital code) of the coarse resolution decoder circuit 112, as described herein. For example, the VID signal can be provided as a PWM signal having a duty-cycle that corresponds to an encoded amplitude for VOUT, the amplitude corresponding to a supply voltage requested by the CPU 102. For example, the VID signal can have an eight-bit signal encoded therein to specify the requested amplitude of VOUT. Therefore, each of $1/256$ steps, and thus approximately 0.4% of change in the duty-cycle of the VID signal, can correspond to a single discrete voltage amplitude step (e.g., approximately 5 millivolts (mV)) in VOUT. As described in greater detail herein, the coarse resolution decoder circuit 112 operates in the digital domain to decode the VID signal, while the fine resolution decoder circuit 114 operates in the analog domain to decode the VID signal.

In an example, the coarse resolution decoder circuit 112 includes a counter 206 and a decoder 208. The counter 206 is configured to sample each period of the VID signal to determine logic-high portions of the period relative to logic-low periods of the period, thereby determining an approximate duty-cycle of the VID signal for a given period of the VID signal. The counter 206 can thus determine a quantity of high counts (HC) and a quantity of low counts (LC) for a given period of the VID signal. The high counts correspond to an on-time of the duty-cycle and the low counts correspond to the off-time of the duty-cycle. The high counts and the low counts are each provided to the decoder 208, such that the decoder 208 can determine an approximate PWM duty-cycle of the VID signal. For example, the decoder 208 can implement a decoding scheme to provide the first digital code, shown in the example of FIG. 2 as CRS, based on a relative difference between the on-time and the off-time of the VID signal.

In an example, the decoding scheme can be implemented by the decoder 208 as a binary search configured to iteratively compare the duty-cycle with a target code that changes by a binary value at each most-significant bit, at each iteration, to determine the first digital code. The binary search can correspond to, or can operate similar to, a successive approximation registers (SAR) algorithm. Therefore, to determine the duty-cycle of the VID signal, the binary search can be implemented in lieu of a division operation, thereby conserving processing power and time.

For example, the binary search can convert the determined on-time (TON) relative to off-time (TOFF) of the duty-cycle of the VID signal into a first digital code corresponding to an eight-bit CRS. The CRS can be expressed as according to the following equations 1 and 2.

$$CRS = TON / (TON + TOFF) * 256 \qquad (1)$$

$$CRS * (TON + TOFF) = TON * 256 \qquad (2)$$

Initially, the target code may be set to an eight-bit code 10000000, which corresponds in value to one-half of a maximum value representable as an eight-bit code, and therefore a digital value of 128 (corresponding to a 50% duty-cycle). Thus, the decoder 208 can compare the TON*256 term with the initial target code*(TON+TOFF) term to determine whether the duty-cycle of the VID signal is greater than or less than 50%. The binary search can thus set the most significant bit (MSB) of the target code to a logic-1 or logic-0 depending on whether the duty-cycle of the VID signal is greater than or less than 50%, respectively. Then, the binary search can iteratively step down to the next highest MSB, set the value to logic-1, and iteratively compare the TON*256 term with the (TON+TOFF)*updated target code term.

As a first example, the first iterative comparison determines that the TON*256 term is greater than the initial target code 10000000*(TON+TOFF) term, and thus the duty-cycle of the VID signal is greater than 50%. Therefore, the binary search sets the MSB of the target code to a logic-1. Then, the binary search iteratively steps down to the next highest MSB and sets the value to logic-1 to iteratively compare the TON*256 term with the updated target code 11000000*(TON+TOFF) term. Therefore, the binary search can determine whether the duty-cycle of the VID signal is greater than or less than 75%.

As a second example, the first iterative comparison determines that the TON*256 term is less than the initial target code 10000000*(TON+TOFF) term, and thus the duty-cycle of the VID signal is less than 50%. Therefore, the binary search sets the MSB of the target code to a logic-0. Then, the binary search iteratively steps down to the next highest MSB and sets the value to logic-1 to iteratively compare the TON*256 term with the updated target code 01000000*(TON+TOFF) term. Therefore, the binary search can determine whether the duty-cycle of the VID signal is greater than or less than 25%.

The binary search can therefore iteratively provide the comparison at each bit of the target code down to the least significant bit (LSB) of the target code. Therefore, the binary search can provide for the eight-bit CRS corresponding to the duty-cycle of the VID signal in eight system clock cycles. The binary search can therefore be rapidly implemented (e.g., in microseconds) to provide CRS. However, due to sampling errors associated the counter 206, CRS may be accurate only to approximately six MSBs. Therefore, the coarse resolution decoder circuit 112 can provide a rapid, but slightly less accurate, decoding of the VID signal. For example, the decoder 208 can provide the eight-bit CRS as an output responsive to completion of the binary search, or can provide the updated target code continuously as an output until the updated target code is completed as the eight-bit CRS.

The fine resolution decoder circuit 114 includes an analog filter 210, an analog-to-digital converter (ADC) 212, and an averaging circuit 214. The analog filter 210 can be configured to filter the period of the VID signal to provide an analog voltage corresponding to the duty-cycle of the VID signal. For example, the analog filter 210 can correspond to a low-pass filter having a time constant T that is less than the time of the period of the VID signal. In an example, the analog filter 210 can be implemented as a fifth order passive resistor-capacitor (RC) filter that provides attenuation of approximately 54 dB at approximately 400 kHz. Thus, the analog filter 210 can have a time constant of approximately 30 µs.

As described above, the analog filter 210 may be biased according to the first digital code provided by the coarse resolution decoder circuit 112. For example, an analog representation of the first digital code may be provided to the analog filter by the DAC 115, determined by the DAC 115 based on the first digital code received from the coarse resolution decoder circuit 112. The analog filter 210 may include a bias or precharge input to receive the analog representation to bias or precharge the analog filter 210 (e.g., a capacitor (not shown) of the analog filter 210) to a value of the analog representation to decrease a time elapsed for the fine resolution decoder circuit 114 to provide an accurate analog value of the duty-cycle of the VID signal. In an example, the analog filter 210 provides the analog value of the duty-cycle of the VID signal to the ADC 212, which in turn provides a corresponding digital representation of the duty-cycle of the VID signal to the averaging circuit 214. In an example, the averaging circuit 214 is a moving average filter of any suitable architecture that provides a moving average of the received digital representation, such as over a programmed number of samples, to provide the second digital code, shown in FIG. 2 as FN. Accordingly, the fine resolution decoder circuit 114 can provide an accurate, but slightly less rapid, decoding of the VID signal, with a time to determine the second digital decode decreased resulting from biasing the fine resolution decoder circuit 114 according to the output of the coarse resolution decoder circuit 112.

The first and second digital codes CRS and FN from the coarse resolution decoder circuit 112 and the fine resolution decoder circuit 114, respectively, are provided to a multiplexer 216. The multiplexer 216 is configured to provide one of CRS or FN as an output signal (VDEC) based on a logic state of a selection signal (SEL). In an example, the logic state of SEL controls whether the multiplexer provides CRS or FN as VDEC. VDEC is in turn implemented by the power controller 108 (e.g., via a DAC (not shown)) to control the amplitude of VOUT based on selective activation of the power stages 106 via the respective signals PWM1 through PWMN.

In the example of FIG. 2, SEL is provided by a resolution selector 218. The resolution selector 218 is configured to monitor CRS and FN to determine a logic state of SEL. For example, the resolution selector 218 may provide SEL at a first logic state to cause the multiplexer 216 to provide CRS as VDEC or at a second logic state to cause the multiplexer 216 to provide FN as VDEC. For example, the resolution selector 218 sets the logic state of SEL based on a difference between CRS and FN. For example, the resolution selector 218 sets SEL to the first logic state responsive to a difference between CRS and FN being greater than a programmed threshold, and sets SEL to the second logic state responsive to the difference between CRS and FN being less than the programmed threshold. In an example, the programmed threshold is 3 (e.g., a value of two asserted LSBs of CRS and FN).

In an example, responsive to a change in the VID signal, both the coarse resolution decoder circuit 112 and the fine resolution decoder circuit 114 can operate to provide CRS and FN corresponding to the updated duty-cycle of the VID signal. However, as described above, CRS may be provided more rapidly by the coarse resolution decoder circuit 112 than FN is provided by the fine resolution decoder circuit 114. Therefore, CRS may be greater in value than FN by more than the predetermined threshold. In such an example, the resolution selector 218 may provide SEL at the first logic state, such that the multiplexer 216 provides CRS as VDEC. Accordingly, the power controller 108 can selectively activate the power stages 106 to change the amplitude of VOUT to an amplitude corresponding to VDEC as defined by CRS.

Continuing the above example, while VOUT settles to the amplitude corresponding to VDEC, as dictated by CRS, the fine resolution decoder circuit 114, as biased according to CRS, continues to decode the VID signal to provide FN. At a subsequent point in time, the resolution selector 218 determines that the difference between CRS and FN is within the predetermined threshold (e.g., within two LSBs). As described above, the fine resolution decoder circuit 114 can provide a more accurate decoding of the VID signal than the coarse resolution decoder circuit 112, but at slower speed than the coarse resolution decoder circuit 112. Therefore, responsive to the difference between CRS and FN being determined to be within the predetermined threshold, the resolution selector 218 changes SEL from the first logic state to the second logic state, such that the multiplexer 216 provides FN as VDEC. Accordingly, the power controller 108 may then selectively activate the power stages 106 to change the amplitude of VOUT to the amplitude corresponding to VDEC as defined by FN. Therefore, VOUT is adjusted to the more accurate amplitude defined by FN. As a result, the VID signal decoder 110 can provide for a rapid, yet less accurate, reaction to the change in the duty-cycle of the VID signal corresponding to a requested change in supply voltage by the CPU 102 based on the coarse resolution decoder circuit 112. The VID signal decoder 110 subsequently provides a more accurate, but less rapidly provided, amplitude of VOUT to the CPU 102 based on the fine resolution decoder circuit 114, biased according to CRS provided by the coarse resolution decoder circuit 112, to meet the requested supply voltage to the CPU 102.

Figure 3:
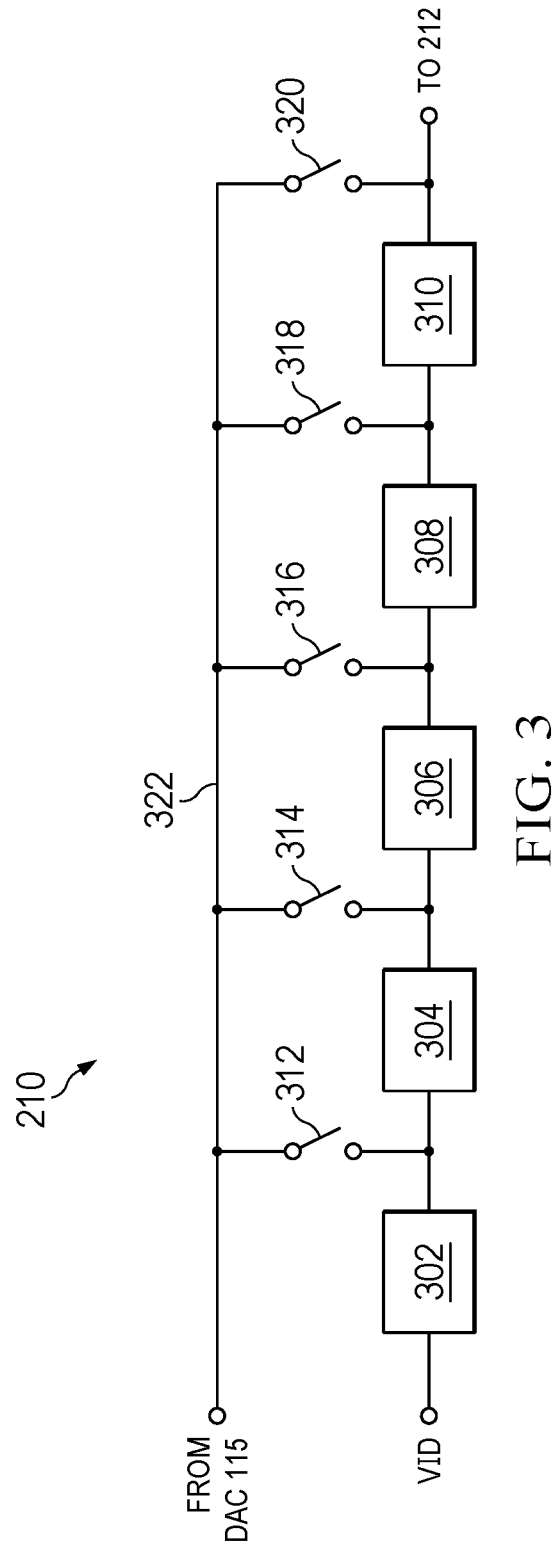
FIG. 3 is a schematic diagram of an analog filter, in accordance with various examples.

FIG. 3 is a schematic diagram of the analog filter 210, in accordance with various examples. The analog filter 210 includes a first input (e.g., an analog VID input), a second input (e.g., a precharge analog input), and an output. In some examples, the analog filter 210 is a fifth-order filter that includes five serially cascaded low-pass filters. For example, the analog filter 210 includes filters 302, 304, 306, 308, and 310. The filter 302 receives the VID signal such that an input of the filter 302 is the input of the first input of the analog filter 210. In an example, the analog filter 210 includes a number of switches equal to a number of filters included in the analog filter 210. For example, the analog filter 210 includes switches 312, 314, 316, 318, and 320. Each of the switches 312-320 may be coupled between a respective filter of the filters 302-310 and a node 322. For example, the switch 312 is coupled between the node 322 and an output of the filter 302, the switch 314 is coupled between the node 322 and an output of the filter 304, the switch 316 is coupled between the node 322 and an output of the filter 306, the switch 318 is coupled between the node 322 and an output of the filter 308, and the switch 320 is coupled between the node 322 and an output of the filter 310. In some examples, each of the switches 312-320 includes a control terminal (not shown) that receives a control signal. The control signal controls a conductive state of the switch. The control signal may be provided according to any suitable control scheme, the scope of which is not limited herein. In some examples, the control signal is provided having an asserted value for a determined amount of time, such as an amount of time approximately equal to a capacitance value of the filter including that capacitor multiplied by the sum of the output impedance of the DAC 115 and a respective switch coupled to that filter. In an example, the node 322 is also the second input of the analog filter 210 and an output of the filter 310 is the output of the analog filter 210. Although the analog filter 210 is shown in FIG. 2 as a fifth-order filter, in various other examples the analog filter 210 may be implemented with a greater or lesser order based on trade-offs between available surface area to be consumed by the implementation of the analog filter 210, attenuation of the analog filter 210, and settling time of the analog filter 210.

In an example of operation, the analog representation is received at the second input of the analog filter 210 (e.g., the node 322). The switches 312-320 are controlled to be closed (e.g., conductive between their respective end terminals) for a determined amount of time to cause the filters 302-310 to be precharged according to the analog representation. At an expiration of the determined amount of time the switches 312-320 are controlled to be open (e.g., non-conductive between their respective end terminals). In this way, rather than a signal being provided at the output of the analog filter 210 based on the VID signal alone, as received by the filter 302, the signal is biased or precharged based on the analog representation received at node 322 to provide an output signal of the analog filter 210 at the output of the filter 310.

Figure 4:
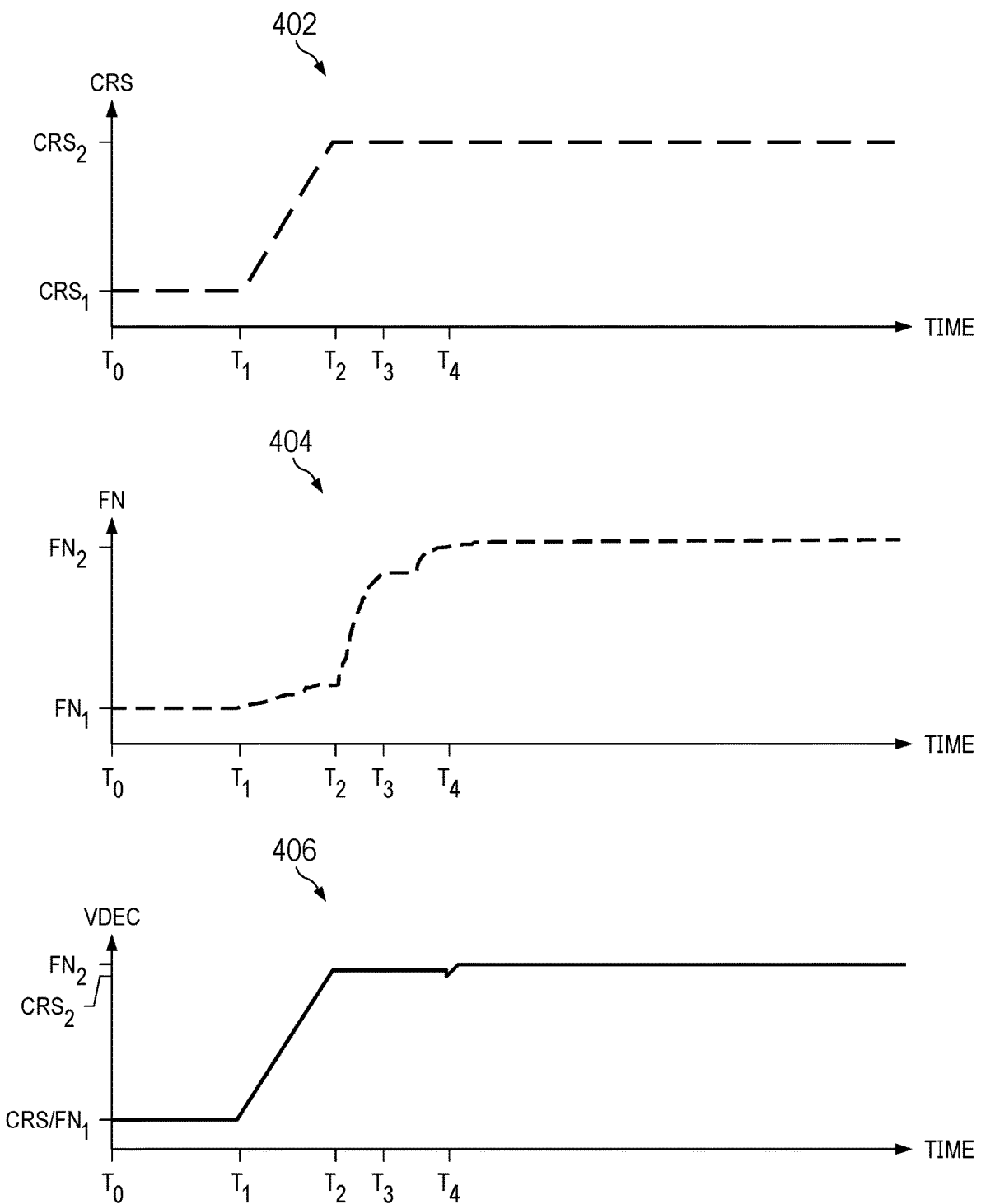
FIG. 4 is timing diagrams, in accordance with various examples.

FIG. 4 is an example of timing diagrams, in accordance with various examples. The timing diagram 400 includes a diagram 402, a diagram 404, and a diagram 406. The diagrams 402, 404, and 406 are shown as coterminous in time, such that the diagrams 402, 404, and 406 are time-aligned. The diagram 402 is an example of the amplitude of CRS provided by the coarse resolution decoder circuit 112 as a dashed line over time. The diagram 404 is an example of the amplitude of FN provided by the fine resolution decoder circuit 114 as a dotted line over time. The diagram 406 is an example of the amplitude of VDEC provided by the multiplexer 216 as a thick solid line, as well as CRS and FN superimposed therein, over time. As shown in the example of FIG. 4, CRS, FN, and VDEC are plotted as being representative of time-based convergence to amplitudes, and are not necessarily intended to represent time-based slew of changing values. In an example, the timing diagram 400 corresponds to the decoding of the VID signal over time by the VID signal decoder 110. Therefore, reference is to be made to the example of FIG. 2, or other drawings of this description, in the following description of the example of FIG. 4.

Initially, at a time T0, the VID signal has a first duty-cycle corresponding to a first amplitude of VOUT. The first amplitude of VOUT can be relatively low, such as based on a lower processing requirement by the CPU 102. Thus, at the time T0, CRS can have an initial value of CRS1 and FN can have an initial value of FN1. At a time T1, the CPU 102 changes the duty-cycle of the VID signal, such as to request a greater amplitude of VOUT. Therefore, at the time T1, the coarse resolution decoder circuit 112 operates to provide CRS to the updated duty-cycle of the VID signal. In the diagram 402, at the time T1, CRS begins to rapidly increase from CRS1 to CRS2.

For example, the decoder 208 provides the updated target code continuously as an output until the updated target code is completed as the eight-bit CRS. Therefore, shortly after the time T1 (e.g., after a first iteration of the binary search), CRS corresponding to the updated target code may be greater than FN by greater than the predetermined threshold. Therefore, the resolution selector 218 can provide SEL at the first logic state, such that the multiplexer 216 provides CRS as VDEC. As a result, in the diagram 406, VDEC is provided as CRS, and thus rapidly increases beginning at T1. Also at T1, the fine resolution decoder circuit 114 begins to charge components (e.g. capacitors of filters 302-310) according to the VID signal to increase the value of FN from FN1.

At a time T2, CRS converges to the value of the VID signal, as decoded by the coarse resolution decoder circuit 112, at a value of CRS2. Accordingly, the power controller 108 can selectively activate the power stages 106 to change the amplitude of VOUT to the amplitude corresponding to VDEC as defined by CRS having the value CRS2. After the time T2, CRS is provided to the fine resolution decoder circuit 114 to bias the fine resolution decoder circuit 114, rapidly increasing the value of FN by time T3. Subsequent to the biasing, the fine resolution decoder circuit 114 decodes the updated VID signal, and thus converges on a value that corresponds to the duty-cycle of the VID signal.

At a time T4, operation of the analog filter 210 may have continued according to the VID signal such that the difference between CRS and FN may be within the predetermined threshold (e.g., 2 LSBs). As a result, the resolution selector 218 switches SEL from the first logic state to the second logic state. Accordingly, the multiplexer 216 provides FN as VDEC. In the example of FIG. 4, at a time T5, FN converges to the value of the VID signal, as decoded by the fine resolution decoder circuit 114, at a value of FN3 that is slightly greater than the value CRS2. Therefore, VDEC increases slightly from the value CRS2 to the value FN3 corresponding to the more accurate decoded value of the duty-cycle of the VID signal. As a result, the VID signal decoder 110 can provide for a rapid reaction to the change in the duty-cycle of the VID signal corresponding to a requested change in supply voltage by the CPU 102 based on the coarse resolution decoder circuit 112, and can ultimately provide for a more accurate amplitude of VOUT to the CPU 102 to meet the demands of the requested supply voltage to the CPU 102.

Figure 5:
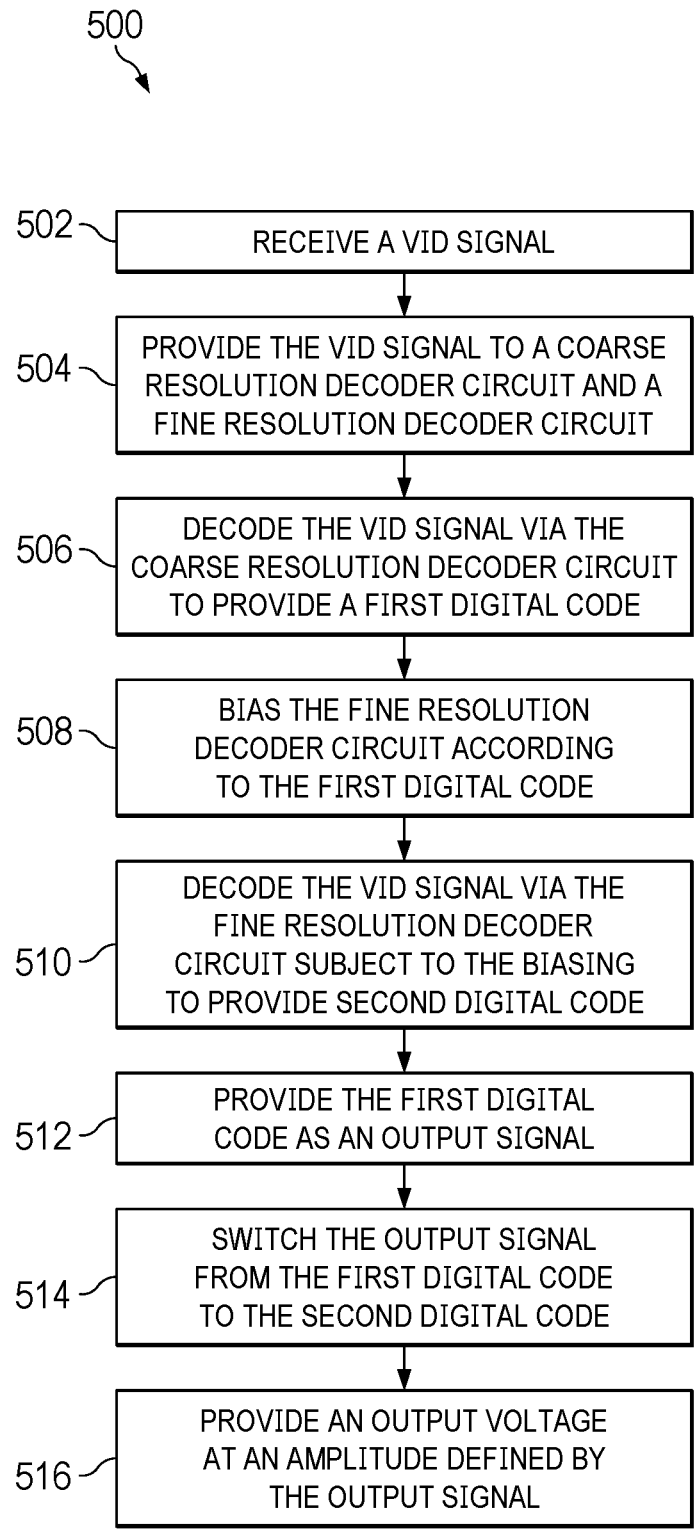
FIG. 5 is flow diagram of a method for providing an output voltage, in accordance with various examples.

FIG. 5 is a flow diagram of a method 500 for providing an output voltage, in accordance with various examples. In at least some examples, the method 500 is implemented by a voltage regulator, such as the voltage regulator 104. At operation 502, a VID signal is received by a VID signal decoder circuit, such as the VID signal decoder 110. The VID signal is encoded with a digital value corresponding to a requested output voltage to be provided by the voltage regulator. At operation 504, the VID signal is provided to a coarse resolution decoder circuit, such as the coarse resolution decoder circuit 112, and a fine resolution decoder circuit, such as the fine resolution decoder circuit 114, of the VID signal decoder. At operation 506, the VID signal is decoded via the coarse resolution decoder circuit to provide a first digital code (e.g., CRS). At operation 508, the fine resolution decoder circuit is biased, or precharged, according to CRS, as described herein. At operation 510, the VID signal is decoded via the fine resolution decoder circuit, subject to the biasing provided according to CRS, to provide a second digital code (e.g., FN). At operation 512, the first digital code is initially provided as an output signal (e.g., VDEC). At operation 514, the output signal is switched from the first digital code to the second digital code responsive to a difference between a relative amplitude of the first and second digital codes being less than a threshold. At operation 516, the output voltage is provided, such as to a CPU, at an amplitude defined by the output signal.

While the operations of the method 500 described herein have been described and labeled with numerical reference, in various examples, the method 500 includes additional operations that are not recited herein. In some examples, any one or more of the operations recited herein include one or more sub-operations. In some examples, any one or more of the operations recited herein is omitted. In some examples, any one or more of the operations recited herein is performed in an order other than that presented herein (e.g., in a reverse order, substantially simultaneously, overlapping, etc.). Each of these alternatives falls within the scope of this description.

The term "couple" is used throughout the specification. The term may cover connections, communications, or signal paths that enable a functional relationship consistent with this description. For example, if device A provides a signal to control device B to perform an action, in a first example device A is coupled to device B, or in a second example device A is coupled to device B through intervening component C if intervening component C does not alter the functional relationship between device A and device B such that device B is controlled by device A via the control signal provided by device A.

A device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof.

A circuit or device that is described herein as including certain components may instead be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be coupled to at least some of the passive elements and/or the sources to form the described structure either at a time of manufacture or after a time of manufacture by an end-user and/or a third-party.

While certain components may be described herein as being of a particular process technology, these components may be exchanged for components of other process technologies. Circuits described herein are reconfigurable to include the replaced components to provide functionality at least partially similar to functionality available prior to the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

Uses of the phrase "ground voltage potential" in the foregoing description include a chassis ground, an Earth ground, a floating ground, a virtual ground, a digital ground, a common ground, and/or any other form of ground connection applicable to, or suitable for, the teachings of this description. In this description, unless otherwise stated, "about," "approximately" or "substantially" preceding a parameter means being within +/−10 percent of that parameter. Modifications are possible in the described examples, and other examples are possible within the scope of the claims.

What is claimed is:

1. An apparatus, comprising:
    a first decoder circuit having a first voltage identification (VID) analog input and a first digital output;
    a precharge circuit having a digital input and a first analog output, the digital input coupled to the first digital output;
    a second decoder circuit having a second VID analog input, a precharge analog input and a second digital output, the precharge analog input coupled to the first digital output; and
    a multiplexer having a multiplexer output and first and second multiplexer inputs, the first multiplexer input coupled to the first digital output, and the second multiplexer input coupled to the second digital output.

2. The apparatus of claim 1, wherein the first decoder circuit includes:
    a counter having a counter input and a counter output, the counter input coupled to the first VID analog input; and a decoder having a decoder input and a decoder output, in which the decoder input is coupled to the counter output, and the decoder output is the first digital output.

3. The apparatus of claim 1, wherein the second decoder circuit includes:
an analog filter having a filter output, the second VID analog input and the precharge analog input;
an analog-to-digital converter (ADC) having an ADC input and an ADC output, the ADC input coupled to the filter output; and
an averaging circuit having an averaging input and an averaging output, in which the averaging input is coupled to the ADC output, and the averaging output is the second digital output.

4. The apparatus of claim 1, wherein the precharge circuit is a digital-to-analog converter (DAC).

5. An apparatus, comprising:
a first decoder circuit having a first voltage identification (VID) analog input and a first digital output, the first decoder circuit configured to provide a first digital code at the first digital output based on a VID signal from the first VID analog input;
a precharge circuit having a digital input and a first analog output, the digital input coupled to the first digital output, the precharge circuit configured to receive the first digital code at the digital input and provide a precharge signal at the first analog output based on the first digital code;
a second decoder circuit having a second VID analog input, a precharge analog input, and a second digital output, the precharge analog input coupled to the first digital output, the second decoder circuit configured to provide a second digital code at the second digital output based on the precharge signal and the VID signal received via the second VID analog input, wherein a resolution of the first decoder circuit is less than a resolution of the second decoder circuit; and
a multiplexer having a multiplexer output, first and second multiplexer inputs, and a selection input, the first multiplexer input coupled to the first digital output, and the second multiplexer input coupled to the second digital output, the multiplexer configured to provide the first digital code at the multiplexer output responsive to a first state of a selection signal at the selection input and to provide the second digital code at the multiplexer output responsive to a second state of the selection signal.

6. The apparatus of claim 5, further comprising a resolution circuit configured to monitor the first and second digital codes to:
provide the selection signal at the first state responsive to a difference between the first and second digital codes being at least a threshold difference; and
provide the selection signal at the second state responsive to the difference between the first and second digital codes being less than the threshold difference.

7. The apparatus of claim 5, wherein the VID signal is a pulse-width modulated (PWM) signal having a duty-cycle representative of a target output voltage.

8. The apparatus of claim 7, wherein the first decoder circuit comprises:
a counter having a counter input and a counter output, the counter input coupled to the first VID analog input, the counter configured to determine an on-time and an off-time of each period of the VID signal; and
a PWM decoder having a decoder input and a decoder output, in which the decoder input is coupled to the counter output, and the decoder output is the first digital output, wherein the PWM decoder configured to provide the first digital code based on a relative difference between the on-time and the off-time of the VID signal.

9. The apparatus of claim 8, wherein the PWM decoder is configured to iteratively compare the duty-cycle with a target code that changes at each iteration to provide the first digital code by decoding the VID signal.

10. The apparatus of claim 8, wherein the precharge circuit comprises a digital-to-analog converter (DAC) having a DAC input and a DAC output, in which the DAC input is coupled to an output of the PWM decoder, the DAC output is coupled to the precharge analog input, and the DAC is configured to provide the precharge signal at the DAC output responsive to the first digital code at the DAC input.

11. The apparatus of claim 7, wherein the second decoder circuit comprises:
an analog filter having a filter output and first and second filter inputs, in which the first filter input is the second VID analog input, the second filter input is the precharge analog input, and the analog filter is configured to provide an analog signal based on the duty-cycle of the VID signal;
an analog-to-digital converter (ADC) having an ADC input and an ADC output, the ADC input coupled to the filter output, and the ADC configured to provide a digital value representative of the analog signal; and
an averaging circuit having an averaging input and an averaging output, in which the averaging output is the second digital output, the averaging input is coupled to the ADC output, and the second digital code is an average of the digital value over a period of time.

12. The apparatus of claim 11, wherein the precharge circuit is a digital-to-analog converter (DAC), the first analog output is coupled to the precharge analog input, the analog filter includes a capacitor coupled between the precharge analog input and a ground terminal, and the DAC is configured to charge the capacitor with the precharge signal.

13. The apparatus of claim 5, wherein the precharge circuit is a digital-to-analog converter (DAC).

14. A voltage regulator, comprising:
power stages configured to provide respective output voltages; and
a power controller configured to:
receive an analog voltage identification (VID) signal representing a target voltage; and
selectively activate one or more of the power stages to reduce a difference between the target voltage and a sum of the respective output voltages, the power controller comprising a VID signal decoder circuit to decode the VID signal, wherein the VID signal decoder circuit includes:
a first decoder circuit having a first voltage identification (VID) analog input and a first digital output, the first decoder circuit configured to provide a first digital code at the first digital output based on a VID signal from the first VID analog input;
a precharge circuit having a digital input and a first analog output, the digital input coupled to the first digital output, the precharge circuit configured to receive the first digital code at the digital input and provide a precharge signal at the first analog output based on the first digital code;
a second decoder circuit having a second VID analog input, a precharge analog input, and a second digital output, the precharge analog input coupled to the first digital output, the second decoder circuit configured to provide a second digital code at the second digital output based on the precharge signal and the VID signal received via the second VID analog input, wherein a resolution of the first decoder circuit is less than a resolution of the second decoder circuit; and a multiplexer having a multiplexer output, first and second multiplexer inputs, and a selection input, the first multiplexer input coupled to the first digital output, and the second multiplexer input coupled to the second digital output, the multiplexer configured to provide the first digital code at the multiplexer output responsive to a first state of a selection signal at the selection input and to provide the second digital code at the multiplexer output responsive to a second state of the selection signal.

15. The voltage regulator of claim 14, wherein the precharge circuit includes a digital-to-analog converter (DAC) configured to receive the first digital code and provide an analog representation of the first digital code as the precharge signal.

16. The voltage regulator of claim 15, wherein the VID signal is pulse-width modulated (PWM) signal having a duty-cycle representative of the target voltage.

17. The voltage regulator of claim 16, wherein the first decoder circuit includes:

a counter having a counter input and a counter output, the counter input coupled to the first VID analog input, the counter configured to determine an on-time and an off-time of each period of the VID signal; and a PWM decoder having a decoder input and a decoder output, in which the decoder input is coupled to the counter output, and the decoder output is the first digital output, wherein the PWM decoder configured to provide the first digital code based on a relative difference between the on-time and the off-time of the VID signal.

18. The voltage regulator of claim 17, wherein the second decoder circuit includes:

an analog filter having a filter output and first and second filter inputs, in which the first filter input is the second VID analog input, the second filter input is the precharge analog input, and the analog filter is configured to provide an analog signal based on the duty-cycle of the VID signal;

an analog-to-digital converter (ADC) having an ADC input and an ADC output, the ADC input coupled to the filter output, and the ADC configured to provide a digital value representative of the analog signal; and an averaging circuit having an averaging input and an averaging output, in which the averaging output is the second digital output, the averaging input is coupled to the ADC output, and the second digital code is an average of the digital value over a period of time.

19. The voltage regulator of claim 18, wherein the DAC is coupled between the PWM decoder and the analog filter to precharge the analog filter.

20. The voltage regulator of claim 14, wherein the VID signal decoder circuit includes a resolution circuit configured to monitor the first and second digital codes to:

provide the selection signal at the first state responsive to a difference between the first and second digital codes being at least a threshold difference; and provide the selection signal at the second state responsive to the difference between the first and second digital codes being less than the threshold difference.

* * * * *